United States Patent [19]

Garrett, Sr. et al.

[11] 4,285,433
[45] Aug. 25, 1981

[54] METHOD AND APPARATUS FOR REMOVING DICE FROM A SEVERED WAFER

[75] Inventors: Robert W. Garrett, Sr., Reading; Donald E. Horning, Wyomissing; Dennis L. Merkel, Hamburg, all of Pa.

[73] Assignee: Western Electric Co., Inc., New York, N.Y.

[21] Appl. No.: 105,464

[22] Filed: Dec. 19, 1979

[51] Int. Cl.³ .............................................. B07C 5/34
[52] U.S. Cl. .................................. 209/573; 209/606; 209/643
[58] Field of Search ................. 209/3.2, 3.3, 573, 643, 209/606; 221/73

[56] References Cited

U.S. PATENT DOCUMENTS

| 2,970,730 | 2/1961 | Schwartz . | |
| 3,031,075 | 4/1962 | Luhn et al. | 209/643 X |
| 3,165,230 | 1/1965 | Hahn | 221/73 |
| 3,497,948 | 3/1970 | Weisler et al. . | |
| 4,046,613 | 9/1977 | Kucheck et al. | 221/73 X |
| 4,138,304 | 2/1979 | Gantley . | |

Primary Examiner—Joseph J. Rolla
Attorney, Agent, or Firm—G. W. Houseweart

[57] ABSTRACT

Removing dice (16) from a wafer (10) which has been attached to a tape layer (12, 14) and severed into individual die (16) leaving the tape layer (12, 14) in one piece is accomplished by attaching the tape layer (12, 14) to a length ot adhesive tape (18). The adhesive tape (18) is passed across a surface (20) and through a slot (38) in the surface (20) causing the die (16) to pass across the slot (38) and away from the tape layer (12, 14) which remains attached to the adhesive tape (18).

7 Claims, 2 Drawing Figures

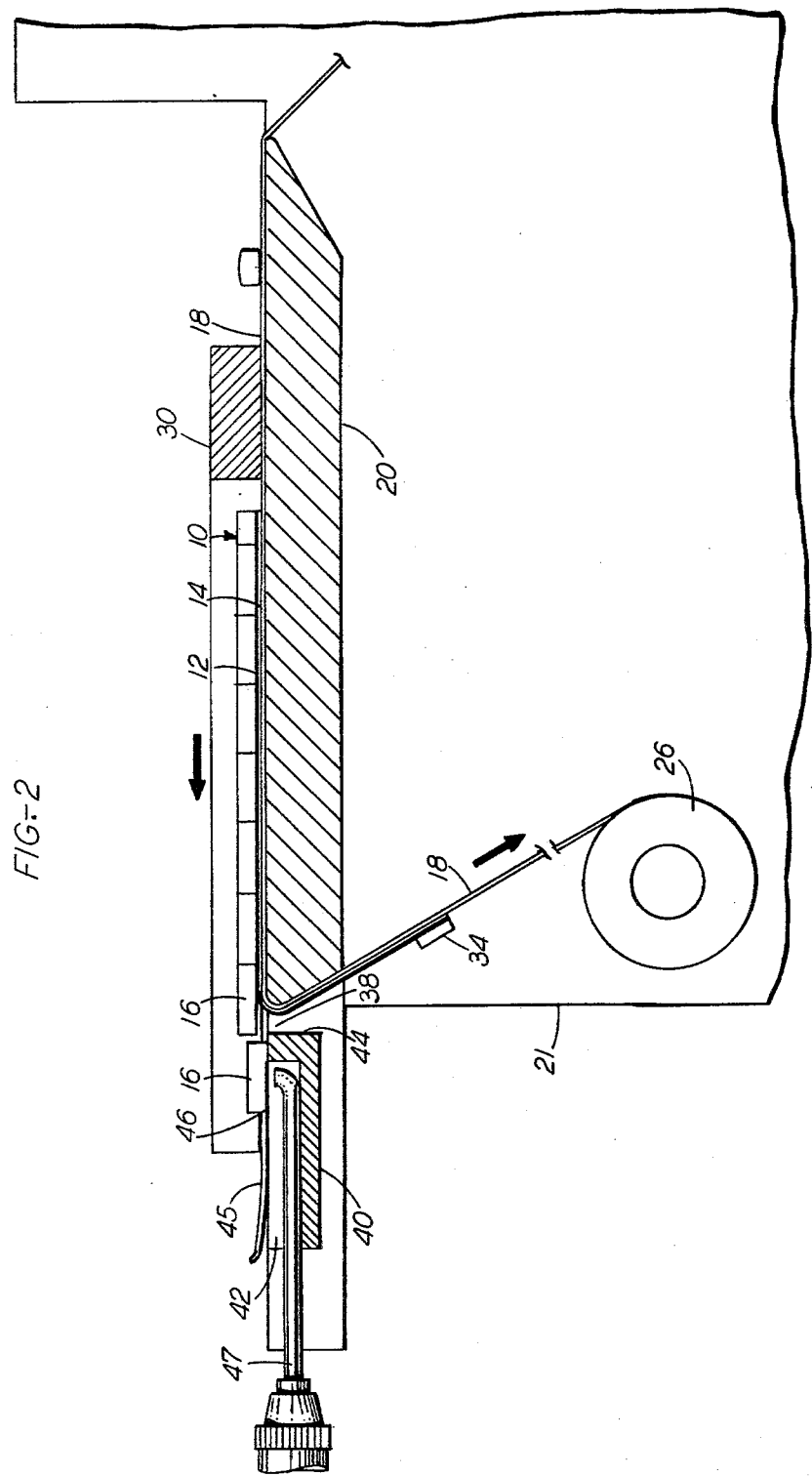

METHOD AND APPARATUS FOR REMOVING DICE FROM A SEVERED WAFER

TECHNICAL FIELD

This invention relates generally to methods and apparatus for handling circuits on a single substrate such as a semiconductor die, and more particularly to methods and apparatus for removing dice from a severed wafer.

BACKGROUND OF THE INVENTION

The fabrication of electronic circuit devices, particularly semiconductor devices, is well suited to batch fabrication on a single substrate usually referred to as a wafer. Separating each of these completed devices, also referred to as dice or chips in the semiconductor industry, from the wafer has often resulted in damage and contamination to the circuits. As a result, methods have been developed in the past to separate the dice with the objective of minimizing this damage and contamination.

A well known method in the semiconductor art is to scribe with a diamond tip a series of lines dividing the dice and then to flex the wafer, causing the dice to break apart. While this method has been highly refined, it still produces a significant percentage of damaged dice, especially when used with relatively larger dice, for example, in the range of 200 mils (0.20 inches, 5.08 mm) on a side. As a result, such dice are usually tested twice, once prior to separation when handling in wafer form is relatively easy; and again after separation, when each individual die must be handled, to verify that previously usable devices have not been degraded by the separation process.

A relatively new technique for separating the dice on a wafer is disclosed by F. C. Gantley in U.S. Pat. No. 4,138,304, in which the wafer is mounted on a vinyl membrane and then sawed into individual dice. The saw cuts through the wafer but not completely through the membrane, thus leaving the dice in place to allow the separated dice to be tested on a conventional wafer tester, thus obviating the need for a preseparation test.

Although severing of the wafer typically has caused the greatest amount of damage and contamination to the dice during the separation process, a significant amount of damage and contamination can occur to each die during the actual removal of each die from the wafer array after the dice have been severed apart. A conventional method shown by Gantley in FIGS. 10 and 11 is to push up each die from the bottom and, using a vacuum pick-up tool, lift from the top of each die. In this manner the die can be segregated into special holders. Alternately, U.S. Pat. No. 2,970,730 to F. W. Schwarz, discloses in FIG. 6 an apparatus for stripping the dice from an adhesive membrane by scraping the dice away from the membrane and allowing the dice to fall together into a trough. Also, M. Wiesler et al., U.S. Pat. No. 3,497,948, discloses positioning the membrane across a vertical edge such that a row of dice have their centers positioned directly over the edge. This causes the wafer to spread and expose the two edges of the dice not supported by the vertical member. An electro-magnetic tweezers then closes to pick up a die by the exposed edges in a clamping action.

Unfortunately, each of these three prior methods can result in damage and/or contamination. The Gantley method places a tool directly on the top or working side of each die exposing the die to damage from any grit or other contamination between the tool and die. Also, the die can be damaged if it is pushed up in a cocked position as often occurs with larger die sizes. Thus the push-up tool must be positioned properly and the adhesive material uniform for proper die-membrane separation.

The Schwarz method of scraping the dice from the membrane stresses and sometimes damages the die by the action of the scraping tool directly on the die, and by the force of the tool pushing the die against the die directly adjacent to it on the membrane. Moreover the collection of the dice in a trough adds another possibility of damage to the dice.

The Wiesler et al. tweezers must be precisely aligned with the die to avoid hitting and damaging the die or an adjacent die. Moreover, the gripping power of the clamp must be firm enough to lift the die from the membrane without tilting and yet loose enough to prevent damage to the die. Thus, die damage can occur from improperly adjusted tweezers.

Therefore, it can be appreciated that an apparatus and method for removing dice from a severed wafer which has a very low incidence of damage or contamination is highly desirable.

SUMMARY OF THE INVENTION

Therefore, it is an object of this invention to provide an apparatus for removing dice from a severed wafer in which the possibility for damage or contamination of the dice is relatively minor.

It is also an object of this invention to provide a method for removing dice from a severed wafer such that the possibility of damaging or contaminating the dice is relatively minor.

It is another object of this invention to provide a method for removing dice from a severed wafer which can be automated.

To these and other ends, an apparatus for removing dice from a severed wafer in accordance with this invention includes a first surface with an edge located therein. A flexible adhesive material attached to the wafer is adapted to pass across the first surface and over an edge in the first surface for releasing the forward advancing edge of a plurality of dice in the wafer from the flexible adhesive material and for pulling away the flexible adhesive material from the remaining portion of the plurality of dice.

A second surface located in a spaced relationship with the first surface forms a slot therebetween. The second surface provides a support for the forward advancing edge of the plurality of dice and also provides a receiving area for the plurality of dice after they have been removed from the flexible adhesive material.

A dice transport tool, which is adapted to fit in a recess in the second surface, attaches to the backside of the dice and transports the dice to a dice storage area.

Also in accordance with this invention is a method of removing dice from a severed wafer which is attached to a flexible adhesive material including the steps of passing the flexible adhesive material across a first surface and over an edge located in the first surface which causes a bending of the flexible material for releasing a forward advancing edge of a plurality of dice in the wafer from the flexible adhesive material.

The forward advancing edges are supported by a second surface which is located in a spaced relationship with respect to the first surface to form a slot therebetween. The flexible adhesive material is further passed over the edge of the first surface to push the plurality of dice forward onto said second surface and to pull the flexible adhesive membrane material away from the remaining portion of the plurality of dice.

BRIEF DESCRIPTION OF THE DRAWINGS

The aforementioned and other features, characteristics, advantages, and the invention in general, will be better understood from the following more detailed description taken in conjunction with the accompanying drawing in which:

FIG. 2 is a partial vertical section through the apparatus of FIG. 1 taken along line 2—2 of FIG. 1.

Figure 1:
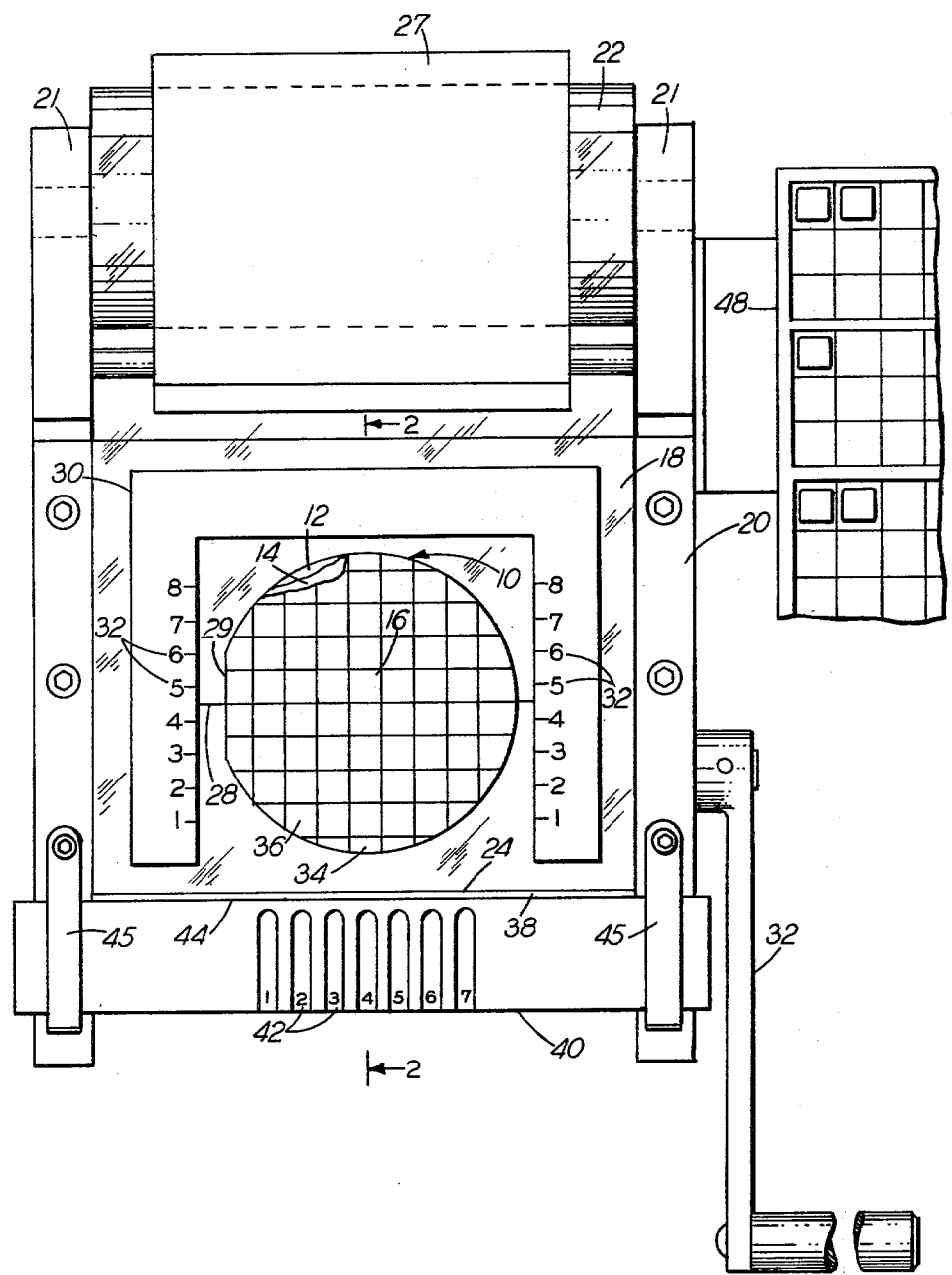
FIG. 1 is a plan view of an apparatus in accordance with the invention for removing dice from a sliced wafer.

It will be appreciated that for simplicity and clarity of explanation the figures have not necessarily been drawn to scale. Further, where considered appropriate, reference numerals have been repeated in both figures to indicate corresponding features.

DESCRIPTION OF THE PREFERRED EMBODIMENT

Reference can now be had to FIG. 1 wherein an apparatus for removing dice from a severed wafer is shown in plan view. A wafer 10 (shown partially broken away) may be of any type of material used to make a plurality of electrical circuits. For example, wafer 10 may contain a plurality of magnetic bubble memory circuits having side dimensions in the range of 0.250 inches (6.35 mm).

Wafer 10 is first prepared for die separation by attaching two layers of adhesive tape 12 (shown partially broken away) and 14 to the backside of wafer 10 prior to a wafer sawing operation. The two layers 12 and 14 are trimmed to conform to the outline of wafer 10.

Advantageously layer 12, which is attached directly to the backside of wafer 10, is a low tack, clean release adhesive tape such as type 336 manufactured by 3M Company, Minneapolis, Minn. The low tack characteristic of this tape is advantageous in minimizing adhesive residue on the back of wafer 10 when tape layer 12 is removed. The second layer of tape 14 has tack properties greater than that of tape layer 12 and is also thicker than layer 12. Tape layer 14 may be of a type designated as type 853 also manufactured by 3M. Layer 14 is added to provide greater thickness to the overall membrane and thereby hold the dice firmly during the wafer sawing operation described next.

Wafer 10 is preferably severed into individual dice 16 using a diamond saw (not shown) which is adjusted to cut deep enough to saw completely through wafer 10, but not deep enough to cut through tape layer 12. The extra thickness provided by layer 14 keeps wafer 10 from cracking during the sawing operation, and also prevents the dice from shifting with respect to each other.

As noted in the BACKGROUND OF THE INVENTION, the dice of wafer 10 are held by layers 12 and 14 in their original alignement after sawing. Thus it is possible to test the dice on wafer 10 in a wafer test fixture after wafer 10 has been severed thus obviating the need for both a preseparation and postseparation test.

The severed wafer 10, with tape layers 12 and 14 affixed thereto, is mounted on a strip or length of adhesive tape 18 which in turn is supported on a surface 20. Tape layers 12, 14, and 18 form a flexible adhesive material. Surface 20 in turn is bolted to and supported by two vertical members 21. Tape 18 is pulled from a supply roll 22, across surface 20, over an edge 24 of surface 20, and onto a take-up reel 26 (shown in FIG. 2). Tape 18 is of a type such as type 681 manufactured by 3M Company. Advantageously tape 18 has a higher tack strength than tape layer 12 for reasons described below.

A weight 27, pivoted on one end, rests against supply roll 22 to provide tension or drag on tape 18. A line 28 on surface 20 aids in aligning wafer 10 when it is placed onto tape 18. Tape 18 is sufficiently transparent that line 28 is visible to an operator.

In operation, the operator aligns a flat side 29 of wafer 10 toward the left side of tape 18 and places one of the saw cuts in wafer 10 on top of line 28. Next a U-shaped member 30 containing row identification numbers 32 along each leg is positioned onto tape 18 to enclose wafer 10 on three sides. U-shaped member 30 serves the dual purpose of holding tape 18 flat and relatively taut during the dice removal process, and of aiding in the identification of each individual die in wafer 10.

After wafer 10 and U-shaped member 30 have been placed onto tape 18, a crank 32 is used to turn take-up reel 26 which in turn advances tape 18 until a front portion 34 of wafer 10, which does not contain any complete circuit elements, has passed over edge 24 and the first row 36 of circuit elements is at edge 24 but still parallel with surface 20. In this manner, tape layers 12 and 14 are started through a to-be-formed slot 38.

Slot 38 is formed by placing a rectangular member 40 (shown in place) containing a plurality of recesses 42, against surface 20 such that edge 24 and side 44 of rectangular member 40 form slot 38 and the top of rectangular member 40 is a second surface flush with surface 20. Rectangular member 40 is then adjusted from side to side until recesses 42 are aligned with dice 16 on wafer 10. Clips 45 are used to hold rectangular member 40 in place.

With reference now to FIG. 2, tape 18 is again advanced to cause a forward advancing edge 46 of the dice along row 36 to pullaway from tape layer 12 and pass across slot 38 while tape layers 12 and 14 remain attached to tape 18. Subsequently, the remaining portion of the dice of row 36 pass across slot 38. Advantageously the tack or adhesive strength of tape layer 14 and tape 18 is chosen to be greater than the tack of tape layer 12 to permit layer 12 to pull away from, rather than adhere to, wafer 10.

When dice 16 of row 36 pass across slot 38, they are supported by rectangular member 40 at a receiving area located over a plurality of recesses 42 in rectangular member 40. A die transport tool, such as a vacuum pick-up 47 is inserted into recess 42 and is used to grasp die 16 from the backside of the die, thereby avoiding damage or contamination to the top side of die 16.

Die 16 is then removed from the apparatus and deposited into one of a plurality of dice storage areas 48 (FIG. 1) depending on the characteristic of each die. Totally unusable die are pushed off into a receptacle (not shown) positioned below rectangular member 40. This segregation of the dice is accomplished by first recording selected characteristics of each die by row and column during the testing and inspection process, and then identifying each row on wafer 10 using U-shaped member 30, and each column by using recesses 42 which correspond with the columns on wafer 10.

After each die 16 in row 36 has been deposited in an appropriate storage area, tape 18 is advanced to place the next row of dice over recessed areas 42. In this manner, all of the die are removed from wafer 10. Then U-shaped member 30 and rectangular member 40 are removed in preparation for the next wafer.

A closer look at the removal of layers 12 and 14 as each die 16 passes across slot 38 will make clear the considerations that are significant in establishing a width for slot 38. As die 16 first starts across slot 38, the tape layer 12 pulls against the forward edge of die 16 with a weaker force than that of tape layers 14 and 18. As a result the low tack properties of tape 12 allow the tape to pull away from die 16 and adhere to tape layers 14 and 18. Die 16, on the other hand, stays parallel to surface 20 since the area of tape 12 tending to pull die 16 through slot 38 is less than the area of tape 12 tending to hold die 16 parallel with surface 20. This imbalance will continue until the force on die 16 at edge 24 is essentially equal to the adhesive force remaining on the rest of die 16. Thus slot 38 must be narrower than the length of cantilevered die 16 at this balance point.

Also, slot 38 must be narrow enough to keep die 16 from falling backwards through the slot after die 16 has become free of tape layers 12 and 14. Thus slot 38 should be narrower than the sum of the thicknesses of the three tape layers plus one-half the length of die 16.

On the other hand, slot 38 must be wide enough to pass all three layers of tape 12, 14, and 18 plus the thickness of wafer 10. In the preferred embodiment, tape layers 12 and 14 together are about 4 mils (0.10 mm) thick, tape layer 18 is about 3 mils (0.07 mm) thick, and wafer 10 is about 10 mils (0.25 mm) giving an overall thickness of about 17 mils (0.43 mm). Slot 38 in the preferred embodiment is about 18 mils (0.46 mm) across. As an alternative to folding the first portion 34 of wafer 10 over edge 24 to assure that tape layers 12 and 14 adhere to tape 18, tape layers 12 and 14 could be cut larger than wafer 10, and thus the leading edge of tape layers 12 and 14 could be secured to tape 18 without having to pass any part of wafer 10 through slot 38. As a result slot 38 could be narrowed appreciably, and rectangular member 40 could be left in place.

The invention described thus removes dice from a severed wafer without touching the top or sides of each die, and without clamping the die in any manner. The apparatus and corresponding method remove dice in a relatively safe and contamination-free method in comparison to provious methods described in the BACKGROUND OF THE INVENTION.

Although the invention has been described in part by making detailed reference to certain specific embodiments, such detail is intended to be and will be understood to be instructive rather than restrictive. It will be appreciated by those in the art that many variations may be made in the structure and mode of operation without departing from the spirit and scope of the invention, as disclosed in the teachings contained herein. For example, the present method could be automated by using automatic positioning of wafer 10 onto tape 18, tensioning of tape 18, placement of rectangular member 40, and pick-up of die 16 and proper placement into the appropriate storage areas 48. Automation would permit this operation to be carried on in an ultra-clean chamber thus reducing further the possibility of contamination.

Two tape layers 12 and 14 are used in the preferred embodiment to provide a combination of a low-tack characteristic (tape layer 12) with the desired thickness (tape layer 14) using commercially availble tape. A single layer of tape having both of these characteristics could be substituted for tape layers 12 and 14.

Although tape layers 12 and 14 are attached to a strip of tape 18 in the preferred embodiment, it will be understood by those skilled in the art that a single length of adhesive tape could be substituted for tape layers 12, 14, and 18. Also, although a sawing technique has been described for severing wafers into dice in the preferred embodiment, other methods of wafer severing, such as laser cutting and scribe and break, could, of course, also be used with this invention.

What is claimed is:

1. Apparatus for separating dice from a severed wafer comprising:
    a first surface with an edge located thereon;
    flexible adhesive material attached to the wafer and adapted to pass across said first surface and over said edge of said first surface for releasing a forward advancing edge of a plurality of dice in the wafer from said flexible adhesive material and for pulling away said flexible adhesive material from the remaining portion of said plurality of dice;
    a second surface located in a spaced relationship with said edge of said first surface forming a slot therebetween and providing a support for said forward advanced edge of said plurality of dice and a receiving area for said plurality of dice after removal from said flexible adhesive material;
    a dice receiving area; and
    a dice transport tool for attaching to the backside of the dice and for transporting the dice to said dice receiving area;
    said receiving area having in said second surface a recess of sufficient size and shape to permit insertion therein of the dice transport tool for attaching to the backside of the dice.

2. Apparatus as set forth in claim 1 wherein said dice receiving area contains a plurality of separated areas and said dice transport tool places each of said dice into one of said plurality of separated areas according to the characteristics of each of the dice.

3. Apparatus as recited in claim 1 wherein said receiving area includes a plurality of said recesses to permit insertion of the dice transport tool, each of said recesses forming in said second surface an opening of lesser lateral extent than the lateral extent of the dice to be received thereupon.

4. Apparatus as set forth in claim 1 wherein said flexible adhesive material is comprised of a first layer of adhesive tape attached directly to the wafer and at least a second layer of adhesive tape, said second layer of adhesive tape attached directly to said first layer of adhesive tape.

5. Apparatus as set forth in claim 4 wherein the adhesive strength of said first layer of adhesive tape is less than that of said second layer and that of any subsequent layers of adhesive tape.

6. A method for separating dice from a sliced wafer attached to a flexible adhesive material comprising the steps of:
    passing the flexible adhesive material across a first surface and over an edge located on said first surface causing a bending of the flexible material and releasing a forward advancing edge of a plurality of dice in the wafer from the flexible adhesive material;
    supporting said forward advancing edge of said plurality of dice with a second surface located in a spaced relationship with said first surface forming a slot therebetween;

further passing said flexible adhesive material over said edge of said first surface for pushing said plurality of dice forward onto said second surface and for pulling the flexible adhesive material away from the remaining portion of said plurality of dice;

positioning a movable tool in a recess in said second surface adjacent to said slot;

attaching said movable tool to the backside of each of the dice after they become free of the flexible adhesive material; and transporting each of the dice with said movable tool to a dice receiving area.

7. A method as set forth in claim 6 wherein each of said dice are transported to one of a plurality of receiving areas depending on the characteristics of each of said dice.

* * * * *